(12) United States Patent
Yu et al.

(10) Patent No.: US 11,304,290 B2
(45) Date of Patent: Apr. 12, 2022

(54) SEMICONDUCTOR STRUCTURES AND METHODS

(71) Applicant: Taiwan Semiconductor Manufacturing Company, Ltd., Hsinchu (TW)

(72) Inventors: Chen-Hua Yu, Hsinchu (TW); Yung-Chi Lin, Su-Lin (TW); Wen-Chih Chiou, Zhunan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 404 days.

(21) Appl. No.: 15/674,388

(22) Filed: Aug. 10, 2017

(65) Prior Publication Data

US 2018/0295717 A1 Oct. 11, 2018

Related U.S. Application Data

(60) Provisional application No. 62/483,198, filed on Apr. 7, 2017.

(51) Int. Cl.
*H01L 23/488* (2006.01)
*H05K 1/02* (2006.01)
(Continued)

(52) U.S. Cl.
CPC ............ *H05K 1/0271* (2013.01); *H01L 21/56* (2013.01); *H01L 21/6835* (2013.01);
(Continued)

(58) Field of Classification Search
CPC ............ H01L 2924/3511; H01L 22/12; H05K 1/0271; H05K 2201/068; H05K 2201/09136
See application file for complete search history.

(56) References Cited

U.S. PATENT DOCUMENTS 5,036,630 A * 8/1991 Kaanta ................ B24B 37/015
451/288
5,986,217 A * 11/1999 Strum ................ H05K 1/0271
174/254
(Continued)

FOREIGN PATENT DOCUMENTS

CN 1753160 A 3/2006
CN 101278393 A 10/2008
(Continued)

*Primary Examiner* — Erin B Saad
*Assistant Examiner* — Carlos J Gamino
(74) *Attorney, Agent, or Firm* — Slater Matsil, LLP

(57) ABSTRACT

A method includes attaching a substrate to a carrier, aligning external connectors on a first surface of a first semiconductor package to first conductive pads on a first surface of the substrate facing away from the carrier, and performing a reflow process, where a difference in coefficients of thermal expansion (CTEs) between the substrate and the carrier causes a first shape for the first surface of the substrate during the reflow process, where differences among CTEs of materials of the first semiconductor package causes a second shape for the first surface of the first semiconductor package during the reflow process, and wherein the first shape substantially matches the second shape. The method further includes removing the carrier from the substrate after the reflow process.

20 Claims, 11 Drawing Sheets

(51) Int. Cl.
  *H01L 21/66* (2006.01)
  *H01L 23/31* (2006.01)
  *H01L 23/00* (2006.01)
  *H01L 23/498* (2006.01)
  *H05K 3/34* (2006.01)
  *H01L 21/56* (2006.01)
  *H01L 21/683* (2006.01)
  *H05K 3/00* (2006.01)
  *H05K 1/11* (2006.01)
  *H01L 23/538* (2006.01)

(52) U.S. Cl.
  CPC ............. *H01L 22/12* (2013.01); *H01L 22/20* (2013.01); *H01L 23/3114* (2013.01); *H01L 23/49816* (2013.01); *H01L 23/49822* (2013.01); *H01L 23/49827* (2013.01); *H01L 24/16* (2013.01); *H01L 24/19* (2013.01); *H05K 3/3436* (2013.01); *H05K 3/3494* (2013.01); *H01L 21/568* (2013.01); *H01L 23/3128* (2013.01); *H01L 23/49833* (2013.01); *H01L 23/5384* (2013.01); *H01L 23/5389* (2013.01); *H01L 24/11* (2013.01); *H01L 24/13* (2013.01); *H01L 24/20* (2013.01); *H01L 2221/68359* (2013.01); *H01L 2221/68372* (2013.01); *H01L 2224/1132* (2013.01); *H01L 2224/1145* (2013.01); *H01L 2224/11334* (2013.01); *H01L 2224/11462* (2013.01); *H01L 2224/11849* (2013.01); *H01L 2224/13111* (2013.01); *H01L 2224/13147* (2013.01); *H01L 2224/16235* (2013.01); *H01L 2224/211* (2013.01); *H01L 2224/73267* (2013.01); *H01L 2924/1203* (2013.01); *H01L 2924/1304* (2013.01); *H01L 2924/181* (2013.01); *H01L 2924/18161* (2013.01); *H01L 2924/19011* (2013.01); *H01L 2924/3511* (2013.01); *H05K 1/111* (2013.01); *H05K 3/007* (2013.01); *H05K 3/0061* (2013.01); *H05K 3/0067* (2013.01); *H05K 2201/068* (2013.01); *H05K 2201/09136* (2013.01); *H05K 2203/163* (2013.01); *H05K 2203/166* (2013.01)

(56) References Cited

U.S. PATENT DOCUMENTS

| | | | |
|---|---|---|---|
| 6,156,623 A * | 12/2000 | Hendrix | C23C 14/50 438/457 |
| 6,177,728 B1 | 1/2001 | Susko et al. | |
| 6,214,733 B1 * | 4/2001 | Sickmiller | H01L 21/6835 438/458 |
| 6,569,711 B1 | 5/2003 | Susko et al. | |
| 6,579,152 B1 * | 6/2003 | Kimura | B24B 37/16 451/41 |
| 7,432,596 B1 * | 10/2008 | Bone | H01L 24/17 257/747 |
| 8,580,683 B2 * | 11/2013 | Wang | H01L 23/562 438/667 |
| 8,729,673 B1 * | 5/2014 | Okandan | H01L 21/78 257/618 |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,912,449 B2 * | 12/2014 | Brown | H01L 24/80 174/256 |
| 8,975,092 B2 * | 3/2015 | Uchibori | H01L 22/20 438/5 |
| 8,993,380 B2 | 3/2015 | Hou et al. | |
| 9,190,388 B2 * | 11/2015 | Sankman | H01L 25/03 |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 9,892,935 B2 * | 2/2018 | Li | H01L 21/4853 |
| 9,929,109 B2 | 3/2018 | Wu et al. | |
| 2002/0075624 A1 * | 6/2002 | Wang | C04B 37/006 361/234 |
| 2005/0253235 A1 * | 11/2005 | Hara | H01L 23/3171 257/678 |
| 2009/0289350 A1 | 11/2009 | Watanabe | |
| 2010/0223030 A1 * | 9/2010 | Hirata | G06F 17/5009 703/1 |
| 2012/0217287 A1 | 8/2012 | Kumar et al. | |
| 2012/0292375 A1 | 11/2012 | Blais et al. | |
| 2013/0323345 A1 * | 12/2013 | Blackshear | H01L 24/75 425/171 |
| 2014/0299999 A1 * | 10/2014 | Hu | H01L 24/96 257/774 |
| 2015/0243642 A1 | 8/2015 | Chen et al. | |
| 2016/0049363 A1 * | 2/2016 | Cheng | H01L 23/28 257/774 |
| 2016/0254209 A1 * | 9/2016 | Oohiraki | H01L 23/473 257/707 |
| 2016/0307815 A1 | 10/2016 | Huang et al. | |
| 2016/0365319 A1 * | 12/2016 | Ryu | H01L 23/562 |
| 2016/0379921 A1 * | 12/2016 | Shin | H01L 23/49838 257/676 |
| 2016/0379939 A1 * | 12/2016 | Minacapelli | H01L 24/83 438/118 |
| 2017/0062241 A1 * | 3/2017 | Rimbert-Riviere | H01L 24/85 |
| 2018/0108559 A1 * | 4/2018 | Balan | H01L 21/68735 |
| 2019/0267332 A1 * | 8/2019 | Sikka | H01L 21/4846 |
| 2019/0378804 A1 * | 12/2019 | Sato | H01L 21/6835 |

FOREIGN PATENT DOCUMENTS

| | | | |
|---|---|---|---|
| JP | 2000150741 A | * | 5/2000 |
| JP | 2010103270 A | | 5/2010 |
| KR | 19990082780 A | | 11/1999 |
| TW | 201519404 A | | 5/2015 |

* cited by examiner

SEMICONDUCTOR STRUCTURES AND METHODS

PRIORITY CLAIM AND CROSS-REFERENCE

This application claims priority to U.S. Provisional Patent Application No. 62/483,198, filed on Apr. 7, 2017, entitled "Semiconductor Structures and Methods," which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints. Another example is a Chip-On-Wafer-On-Substrate (CoWoS) structure, where a semiconductor chip is attached to a wafer (e.g., an interposer) to form a Chip-On-Wafer (CoW) structure. The CoW structure is then attached to a substrate (e.g., a printed circuit board) to form a CoWoS structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of semiconductor manufacturing, and in particular, in the context of forming three-dimensional (3D) semiconductor structures. In some embodiments, the 3D semiconductor structure comprises a semiconductor package attached to conductive pads on a first side of a substrate. A second side of the substrate opposing the first side is attached to a carrier. In some embodiments, warpage occurs for the semiconductor package and the substrate during a reflow process, due to mismatch of the coefficients of thermal expansion. In accordance with some embodiments, the carrier is designed to induce a predetermined level of warpage in the substrate, such that a first warpage of the first side of the substrate substantially matches a second warpage of the lower surface of the semiconductor package. Cold joints are reduced or prevented by the present disclosure, and process yield is improved.

Figure 1:
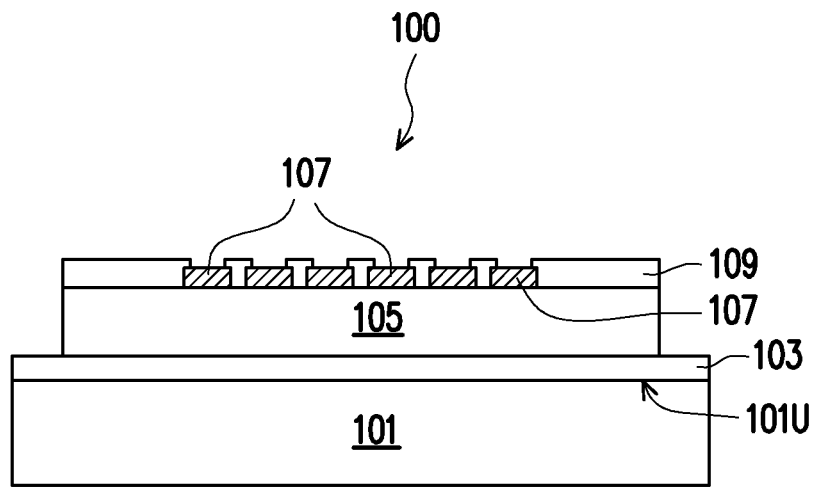
FIGS. 1-4 illustrate cross-sectional views of a semiconductor device at various stages of fabrication, in accordance with an embodiment.

FIGS. 1-4 illustrate the cross-sectional views of a semiconductor device 100 at various stages of fabrication. Referring to FIG. 1, a substrate 105 is attached to a carrier 101 via an adhesive layer 103. The substrate 105 may be made of bismaleimide triazine (BT) resin, FR-4 (a composite material composed of woven fiberglass cloth with an epoxy resin binder that is flame resistant), ceramic, glass, plastic, tape, film, or other supporting materials. As illustrated in FIG. 1, conductive pads 107, such as aluminum pads or copper pads, are formed on the upper surface of the substrate 105. The conductive pads 107 may be electrically connected to conductive features (e.g., conductive lines or vias, not shown) formed in the substrate 105. The conductive pads 107 may be used to electrically couple (e.g., through soldering) the substrate 105 to other electrical devices or components (e.g., semiconductor dies, semiconductor packages, capacitors, inductors, resistors, diodes, etc.) bonded to the substrate 105. In some embodiments, the substrate 105 may include electrical components, such as resistors, capacitors, signal distribution circuitry, combinations of these, or the like. These electrical components may be active, passive, or a combination thereof. In other embodiments, the substrate 105 is free from both active and passive electrical components therein. All such combinations are fully intended to be included within the scope of the embodiments.

In some embodiments, the substrate 105 is a printed circuit board (PCB), such as a single-layer PCB or a multiple-layer PCB. Metal interconnects (not shown), which includes metal lines and vias, are formed in/on the PCB, and are electrically coupled to the conductive pads 107. For example, in a single-layer PCB, metal lines may be formed on one side or both sides of the PCB, and vias may be formed extending through the PCB and connecting the metal lines on both sides of the PCB. Although not shown in FIG. 1, the conductive pads 107 may also be formed on the lower side of the substrate 105 facing the carrier 101. In embodiments where the substrate 105 is a multi-layer PCB, metal lines and vias are further formed in one or more layers of the substrate 105 between the two opposing sides of the substrate 105. As illustrated in FIG. 1, a passivation layer 109, such as a solder resist, is formed over the substrate 105 and over the conductive pads 107. Openings are formed in the passivation layer 109 to expose the conductive pads 107. In an exemplary embodiment, the substrate 105 is a PCB with a dimension of about 30 mm by about 30 mm, or larger, although other dimensions are also possible.

The carrier 101 comprises a rigid material and has a upper surface 101U. The upper surface 101U may be flat at, e.g., room temperature. The lower surface of the substrate 105 is attached to the upper surface 101U of the carrier 101. The carrier 101 is a temporary carrier that is used to support the substrate 105 in subsequent processing, e.g., a bonding process. Thereafter, the carrier 101 is removed from the substrate 105 once the bonding process is finished, in some embodiments.

The carrier 101 may comprise any suitable material that could provide structural support for the substrate 105. For example, the carrier 101 may comprise metal (e.g., steel), glass, ceramic, silicon (e.g., bulk silicon), combinations thereof, multi-layers thereof, or the like. In some embodiments, the coefficient of thermal expansion (CTE) of the carrier 101 is tuned such that after the substrate 105 is attached to the carrier 101 and during a reflow process, a mismatch (e.g., differences) between the CTE of the carrier 101 and the CTE of the substrate 105 induces a predetermined (e.g., designed) level of warpage of the substrate 105. Details of which will be discussed hereinafter.

In some embodiments, only one substrate 105 is attached to the carrier 101, and no other substrate is attached to the carrier 101. In other words, one carrier 101 supports only one substrate 105. In other embodiments, more than one substrates 105 are attached to the carrier 101, therefore, one carrier 101 supports multiple substrate 105. The shape of the carrier 101 in a plan view (not shown) may be any suitable shape to accommodate the one or more substrates 105. For example, the carrier 101 may have a rectangular shape, a square shape, a polygon shape, or a circular shape. The size (e.g., surface area) of the carrier 101 is equal to or larger than the size (e.g., surface area) of the one or more substrates 105 attached to it, in some embodiments. In embodiments where one carrier 101 supports one substrate 105, a shape of the carrier 101 is the same or similar as a shape of the substrate 105. For example, both the carrier 101 and the substrate 105 may have a same rectangular shape or similar rectangular shapes in the plan view. Note that since the surface area of the carrier 101 is equal to or larger than the surface area of the substrate 105, the substrate 105 is fully supported by the carrier 101 from underneath. For example, in a plan view, the substrate 105 is disposed within the exterior perimeters of the carrier 101.

In the example of FIG. 1, the substrate 105 is attached to the carrier 101 by the adhesive layer 103. In some embodiments, the adhesive layer 103 is a polymer adhesive layer. For example, the adhesive layer 103 may be a light-to-heat conversion (LTHC) film which reduces or loses its adhesiveness when exposed to a radiation source (e.g., ultra-violet light, or a laser). Therefore, to remove the carrier 101 from the substrate 105 in subsequent processing, an ultra-violet (UV) light or a laser may be shined onto the adhesive layer 103 (e.g., an LTHC film) to easily remove the carrier 101 and the adhesive layer 103 from the substrate 105. Other suitable adhesive layers, such as die attaching film (DAF), may also be used, and the removal process of the carrier 101 may include a mechanical peel-off process, a grinding process, or an etching process, and may include additional cleaning process. In some embodiments, the adhesive layer 103 is removed by applying water to the adhesive layer 103.

Figure 2:
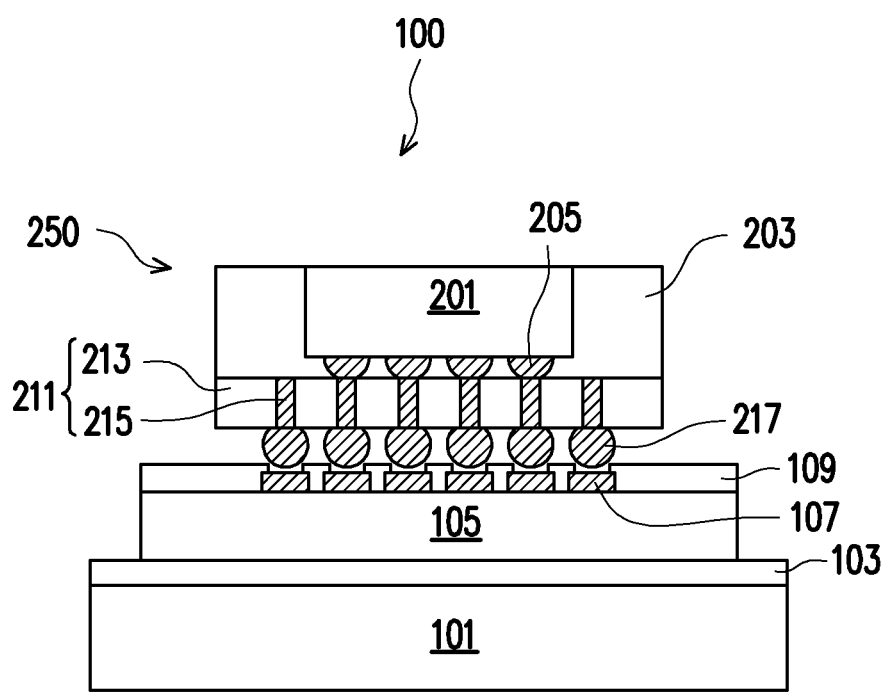

Next, as illustrated in FIG. 2, a semiconductor package 250 is disposed over the substrate 105. External connectors 217 of the semiconductor package 250 are aligned with respective conductive pads 107 of the substrate 105 in preparation for a subsequent bonding process (e.g., a reflow process). Solder paste (not shown) may be dispensed over the conductive pads 107 to temporarily attach the semiconductor package 250 to the substrate 105.

The semiconductor package 250 may be a System-On-Chip (SoC), an Integrated-Fan-Out (InFO) package, a Chip-On-Wafer-On-Substrate (CoWoS) package, as examples. In the example of FIG. 2, the semiconductor package 250 is a Chip-On-Wafer (CoW) package, which will be bonded with the substrate 105 in subsequent processing to form a CoWoS package.

As illustrated in FIG. 2, the semiconductor package 250 comprises a semiconductor die (also referred to as die) 201 attached to an upper side of an interposer 211 through die connectors 205. The semiconductor package 250 further comprises a molding material 203 over the upper side of the interposer 211 and around the die 201, and external connectors 217 electrically coupled to a lower side of the interposer 211.

Details of the semiconductor package 250 are described hereinafter. The semiconductor die 201 may comprise a substrate (not individually illustrated), electrical components on the substrate (not individually illustrated), metallization layers (not individually illustrated) over the substrate, a passivation layer (not individually illustrated) over the metallization layer, conductive pads (not individually illustrated) over the passivation layer, and die connectors 205. In an embodiment the substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The electrical components comprise a wide variety of active devices (e.g., transistors) and passive devices (e.g., capacitors, resistors, inductors) and the like that may be used to generate the desired structural and functional requirements of the design for the semiconductor die 201. The electrical components may be formed using any suitable methods either within or else on the substrate of the die 201.

The metallization layers are formed over the substrate and the electrical components and are designed to connect the various electrical components to form functional circuitry. In an embodiment the metallization layers are formed of alternating layers of dielectric and conductive material and may be formed through any suitable process (such as deposition, damascene, dual damascene, etc.). In an embodiment there may be four layers of metallization separated from the substrate by at least one interlayer dielectric layer (ILD), but the precise number of metallization layers is dependent upon the design of the semiconductor die 201.

The passivation layer may be formed over the metallization layers in order to provide a degree of protection for the underlying structures. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized.

The conductive pads may be formed over and in electrical contact with the metallization layer. The conductive pads may comprise aluminum, but other materials, such as copper, may alternatively be used. The conductive pads may be formed using a deposition process, such as sputtering or plating, to form a layer of material (not shown) and portions of the layer of material may then be removed through a suitable process (such as photolithographic masking and etching) to form the conductive pads. However, any other suitable process may be utilized to form the conductive pads.

The die connectors 205 may be formed on conductive pads to provide conductive regions for contact between the metallization layers of the die 201 and, e.g., the conductive path 215 of the interposer 211. In an embodiment the die connectors 205 may be contact bumps such as microbumps and may comprise a material such as tin, or other suitable materials, such as silver or copper. In an embodiment in which the die connectors 205 are tin solder bumps, the die connectors 205 may be formed by initially forming a layer of tin through any suitable method such as evaporation, electroplating, printing, solder transfer, ball placement. Once a layer of tin has been formed on the structure, a reflow is performed in order to shape the material into the desired bump shape with a diameter of about, e.g., 10 μm to 100 μm, although any suitable size may alternatively be utilized.

However, as one of ordinary skill in the art will recognize, while the die connectors 205 have been described above as microbumps, these are merely intended to be illustrative and are not intended to limit the embodiments. Rather, any suitable type of external contacts, such as controlled collapse chip connection (C4) bumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the die connectors 205, and all such external connectors are fully intended to be included within the scope of the embodiments.

Looking at the interposer 211, which includes a substrate 213 and conductive path 215 (e.g., through substrate vias (TSVs)). The substrate 213 may be, e.g., a silicon substrate, doped or undoped, or an active layer of a silicon-on-insulator (SOI) substrate. However, the substrate 213 may alternatively be a glass substrate, a ceramic substrate, a polymer substrate, or any other substrate that may provide a suitable protection and/or interconnection functionality. These and any other suitable materials may alternatively be used for the substrate 213.

In some embodiments, the substrate 213 may include electrical components, such as resistors, capacitors, signal distribution circuitry, combinations of these, or the like. These electrical components may be active, passive, or a combination thereof. In other embodiments, the substrate 213 is free from both active and passive electrical components therein. All such combinations are fully intended to be included within the scope of the embodiments.

Additionally, in some embodiments the substrate 213 is a semiconductor wafer. As such, when one or more semiconductor dies, e.g., die 201, are bonded to the substrate 213, the combined structure may form a Chip-On-Wafer (CoW) configuration.

The conductive paths 215 may be TSVs or any other suitable conductive paths. In embodiments where conductive paths 215 are TSVs, the TSVs may be formed by initially forming electrically conductive paths partially through the substrate 213, then thinning the substrate 213 later to expose the electrically conductive paths. In other embodiments, the conductive paths 215, when formed initially, extends through the substrate 213, and no thinning of the substrate 213 is needed. The conductive paths 215 may be formed by forming a suitable photoresist or a hard mask on the substrate 213, patterning the photoresist or the hard mask, and then etching the substrate 213 to generate openings (e.g., TSV openings).

Once the openings for the conductive paths 215 have been formed, the openings may be filled with, e.g., a liner (not separately illustrated in FIG. 2), a barrier layer (also not separately illustrated in FIG. 2), and a conductive material. In an embodiment the liner may be a dielectric material such as silicon nitride, silicon oxide, a dielectric polymer, combinations of these, or the like, formed by a process such as chemical vapor deposition, oxidation, physical vapor deposition, atomic layer deposition, or the like.

The barrier layer may comprise a conductive material such as titanium nitride, although other materials, such as tantalum nitride, titanium, another dielectric, or the like may alternatively be utilized. The barrier layer may be formed using a CVD process, such as plasma-enhanced CVD (PECVD). However, other alternative processes, such as sputtering or metal organic chemical vapor deposition (MOCVD), atomic layer deposition (ALD), may alternatively be used. The barrier layer may be formed so as to contour to the underlying shape of the opening for the conductive paths 215.

The conductive material may comprise copper, although other suitable materials such as aluminum, tungsten, alloys, doped polysilicon, combinations thereof, and the like, may alternatively be utilized. The conductive material may be formed by depositing a seed layer and then electroplating copper onto the seed layer, filling and overfilling the openings for the conductive paths 215. Once the openings for the conductive paths 215 have been filled, excess barrier layer and excess conductive material outside of the openings may be removed through a grinding process such as chemical mechanical polishing (CMP), although any suitable removal process may be used.

Although not shown in FIG. 2, a redistribution structure may be formed on the upper side of the substrate 213 facing the die 201, in order to provide electrical interconnectivity between the conductive paths 215, the die connectors 205, and the semiconductor die 201. The redistribution structure comprises redistribution layers (RDLs) (e.g., conductive lines and/or vias) disposed in one or more dielectric layers of the redistribution structure. The redistribution structure may be formed using common methods for forming interconnect structures in integrated circuits, details are not repeated here.

Once the redistribution structure has been formed, conductive pads (not illustrated) may be formed over and in electrical connection with the RDL on the upper side of the substrate 213. The conductive pads may comprise aluminum, but other materials, such as copper, may alternatively be used. The conductive pad may be formed using a deposition process, such as sputtering, to form a layer of material (not shown) and portions of the layer of material may then be removed through a suitable process (such as photolithographic masking and etching) to form the conductive pad. However, any other suitable process may be utilized to form the conductive pad.

Next, external connectors 217 may be formed on the lower side of the substrate 213 and may be electrically coupled to the RDL though, e.g., conductive paths 215. The external connectors 217 are physically and electrically coupled to the substrate 105 in subsequent processing (see FIGS. 3A and 3B), e.g., by a reflow process, to form a CoWoS structure. The external connectors 217 may be copper pillars, controlled collapse chip connection (C4) bumps, microbumps, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like. Any suitable external connector, and any suitable process for forming the external connectors, may be utilized for the external connectors 217, and all such external connectors are fully intended to be included within the scope of the embodiments.

Once ready, the semiconductor die 201 may be bonded to the interposer 211 using, e.g., a bonding process. For example, a reflow process may be performed to bond the die connectors 205 with respective contact pads (not shown) on the upper side of the substrate 213.

Once bonded, an underfill material (not shown) may be injected or otherwise formed in the space between the interposer 211 and the semiconductor die 201. The underfill material may, for example, comprise a liquid epoxy that is dispensed between the semiconductor die 201 and the substrate 213, and then cured to harden. In other embodiments, no underfill is uses. Instead, the gap between the die 201 and the substrate 213 is filled by a molding material 203 described hereinafter.

Next, the molding material 203 is formed on the upper side of the substrate 213. The molding material 203 surrounds the semiconductor die 201, in some embodiments. The molding material 203 may comprise an epoxy, an organic polymer, a polymer with or without a silica-based or glass filler added, or other materials, as examples. In some embodiments, the molding material 203 comprises a liquid molding compound (LMC) that is a gel type liquid when applied. The molding material 203 may also comprise a liquid or solid when applied. Alternatively, the molding material 203 may comprise other insulating and/or encapsulating materials. The molding material 203 is applied using a wafer level molding process in some embodiments. The molding material 203 may be molded using, for example, compressive molding, transfer molding, molded underfill (MUF), or other methods.

Next, the molding material 203 is cured using a curing process, in some embodiments. The curing process may comprise heating the molding material 203 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 203 may be cured using other methods. In some embodiments, a curing process is not included. Next, a planarization process, such as a CMP process, may be performed to planarize the upper surface of the cured molding material 203. The semiconductor package 250 is therefore formed.

Figure 3A:
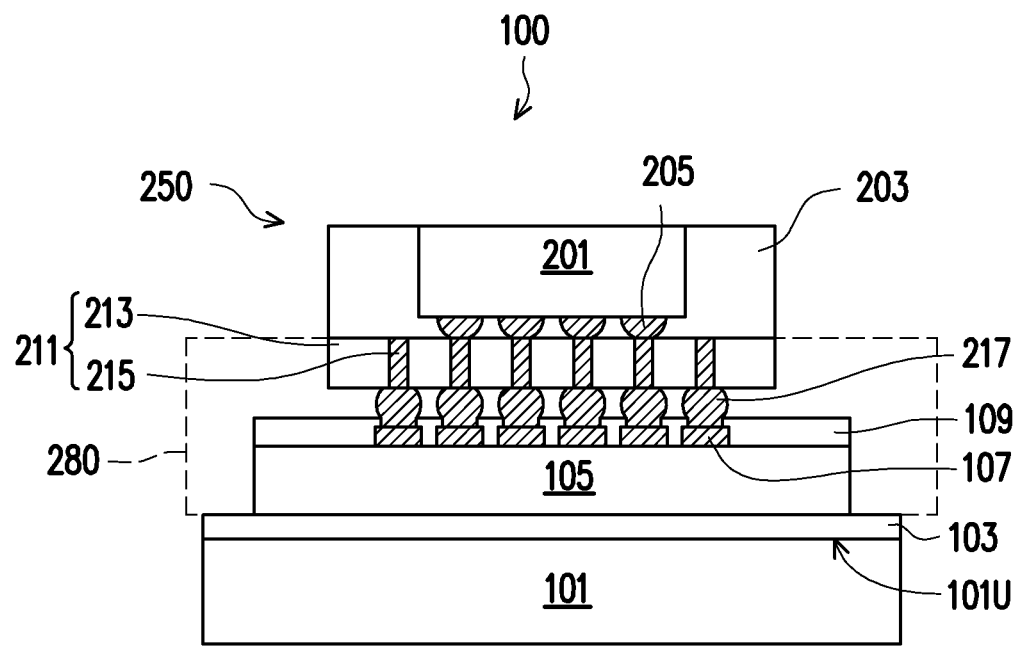

Next, as illustrated in FIG. 3A, the semiconductor package 250 is physically and electrically coupled to the substrate 105 through a bonding process (e.g., a reflow process). In the bonding process, the external connectors 217 of the semiconductor package 250 are aligned with respective conductive pads 107 of the substrate 105. In some embodiments, solder paste is dispensed on the conductive pads 107 using, e.g., a solder jet printing processing. Next, the external connectors 217 of the semiconductor package 250 are brought into contact with the respective conductive pads 107 of the substrate 105. A reflow process may then be performed to bond the external connectors 217 of the semiconductor package 250 with the respective conductive pads 107 of the substrate 105. The reflow process may be performed at a temperature of about 220° C. or higher.

Solder regions (not individually illustrated) may be formed between the conductive pads 107 and conductive paths 215 after the reflow process. In embodiments where the external connectors 217 comprise copper pillars, the solder region may be formed between the copper pillar and the conductive pads 107. In embodiments where the external connectors 217 are solder bumps (e.g., C4 bumps), the solder of the external connectors 217 melts during the reflow process and form at least portions of the solder regions between the conductive pads 107 and the conductive path 215.

Figure 3B:
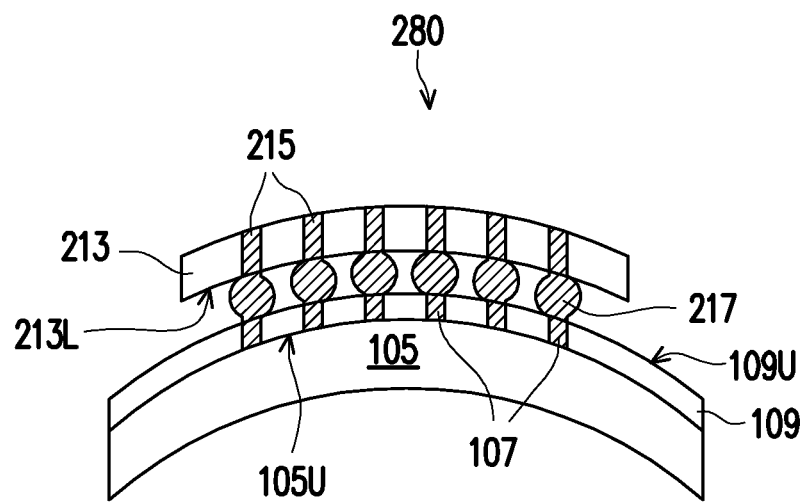

Referring now to FIG. 3B, which shows a zoomed-in view of an area 280 in FIG. 3A. The substrate 105 and the semiconductor package 250 may be warped at the reflow temperature, as illustrated in FIG. 3B and discussed below. The level of warpage is exaggerated in FIG. 3B for illustration purpose. Due to the mismatch of the CTEs of different materials of the semiconductor package 250, warpage of the semiconductor package 250 may occur at the reflow temperature (e.g., 220° C. or higher). For example, the molding material 203 may have a higher CTE than that of the substrate 213. As a result, the lower surface 213L of the semiconductor package 250 is warped (e.g., curved) instead of flat. In particular, the center of the lower surface 213L of the substrate 213 is higher (e.g., extends further away from the carrier 101) than the two end portions of the lower surface 213L. The curved lower surface 213L of the substrate 213 in FIG. 3B is also described as bowing upwards. The example of FIG. 3B is merely an example. In other embodiments, the CTE mismatch between materials of the semiconductor package 250 may result in the lower surface 213L of the substrate 213 to bow downwards, e.g., the center of the lower surface 213L of the substrate 213 is lower (e.g., extends closer to the carrier 101) than the end portions of the lower surface 213L.

Similarly, the mismatch between the CTE of the substrate 105 and the CTE of the carrier 101 may result in warpage of the substrate 105 during the reflow process. The upper surface 105U of the substrate 105 may, therefore, bow upwards or bow downwards, depending on the CTE of the substrate 105 and the CTE of the carrier 101. Since the external connectors 217 are attached to the lower surface 213L of the substrate 213, the bowing of the substrate 213 causes the bottom surfaces (e.g., the lowest portion of the external connectors 217 in FIG. 3B) of the external connectors 217 to be on a curved plane. If the upper surface 105U of the substrate 105, on which the conductive pads 107 are formed, is flat, or has a different shape and/or a different curvature from that of the curved plane of the external connectors 217, it would be very difficult to bond all of the external connectors 217 to the respective conductive pads 107, simply because some external connectors 217 would not contact the respective conductive pads 107 during the reflow process. This may result in cold joints between the external connectors 217 and the conductive pads 107. Cold joints result in defective semiconductor devices and reduce yields of the semiconductor manufacturing.

As illustrated in FIG. 3B, the present disclosure reduces or prevents cold joints by inducing a predetermined level of warpage to the substrate 105 during the reflow process, such that a shape (e.g., bowing upwards or bowing downwards) and/or a curvature (e.g., level of bowing) of the upper surface 105U of the substrate 105 substantially matches a shape and/or a curvature of the lower surface 213L of the semiconductor package 250, in some embodiments. Since the passivation layer 109 has a substantially uniform thickness, an upper surface 109U of the passivation layer 109 may have a same shape and/or a same curvature as the upper surface 105U of the substrate 105. Similarly, the upper surfaces of the conductive pads 107 are in a curved plane which may also have a same shape and/or a same curvature as the upper surface 105U.

Still referring to FIG. 3B, by matching the warpage of the substrate 105 to the warpage of the semiconductor package 250, all of the external connectors 217 of the semiconductor package 250 are in contact with the respective conductive pads 107 during the reflow process (e.g., when the semiconductor package 250 and the substrate 105 are both warped), thus forming a reliable bonding (e.g., electrical connection) between the semiconductor package 250 and the substrate 105.

In some embodiments, inducing the predetermined level of warpage to the substrate 105 comprises analyzing the warpage of the semiconductor package 250 at the reflow temperature, determining a first shape of the warped lower surface 213L of the semiconductor package 250 at the reflow temperature, and adjusting a CTE of the carrier 101 such that a mismatch between the CTE of the carrier 101 and the CTE of the substrate 105 results in a warpage of the substrate 105 during the reflow process, where a second shape of the warped upper surface 105U of the substrate 105 substantially matches the first shape of the warped lower surface 213L of the semiconductor package 250 during the reflow process.

In some embodiments, analyzing the warpage of the semiconductor package 250 comprises estimating the warpage of the semiconductor package 250 through computer simulations. For example, the dimensions, the structure, the materials of the semiconductor package 250, and the reflow temperature may be entered as input parameters to a computer simulation program, and the specifics (e.g., the shape, the curvature) regarding the warpage of the semiconductor package 250 is then generated by the computer program.

In some embodiments, the warpage of the semiconductor package 250 is obtained by measuring and analyzing moiré patterns using a defect inspector. The moiré patterns may be generated using known methods in the art. For example, a reference pattern etched on a low expansion quartz glass may be projected onto the warped surface of the semiconductor package 250. When observed from above the quartz glass, the geometric inference between the reference pattern and the projected pattern on the warped surface of the semiconductor package 250 produces a moiré pattern. A defect inspector, such as the ICOS optical defect inspector from KLA-Tencor Corporation may be used to measure the level of warpage.

As a result of the analysis of the warpage of the semiconductor package 250, the specifics such as the shape and/or the curvature of the lower surface 213L of the semiconductor package 250 is obtained. These specifics may be used as the target for the induced warpage of the substrate 105, as discussed below.

In some embodiments, inducing the predetermined level of warpage of the substrate 105 comprises tuning the CTE of the carrier 101 with respect to the CTE of the substrate 105, such that at the reflow temperature, the mismatch of the CTEs between the substrate 105 and the carrier 101 results in a curved upper surface 105U that substantially matches the curved lower surface 213L of the semiconductor package 250. As an example, consider the case where the lower surface 213L bows upwards as illustrated in FIG. 3B (e.g., due to the CTE of molding material 203 being larger than the CTE of the substrate 213), the CTE of the carrier 101 is tuned to be smaller than the CTE of the substrate 105, such that the mismatch of CTEs between the substrate 105 and the carrier 101 causes the upper surface 105U of the substrate 105 to bow upwards, therefore matching the curved lower surface 213L. As another example, consider the case where the lower surface 213L bows downwards. In this case, the CTE of the carrier 101 is tuned to be larger than the CTE of the substrate 105, such that the mismatch of CTEs between the substrate 105 and the carrier 101 causes the upper surface 105U of the substrate 105 to bow downwards as well, thus matching the curved lower surface 213L.

One skilled in the art will appreciate that "substantially matches" here refers to matching within an error margin. For example, a distance between the curved lower surface 213L and the curved upper surface 105U may have a value that deviates (e.g., being larger than or smaller than) from an expected value (e.g., a value equal to the sum of a height of the external connectors 217 and a thickness of the passivation layer 109) by less than about 20 percent. For example, the thickness of the passivation layer 109 may be 20 µm, the height of the external connectors 217 may be 80 µm, and the distance between the curved lower surface 213L and the curved upper surface 105U may have a value that deviates from the expected value of 100 µm by, e.g., about 10 percent to about 20 percent. As a result of the matching of the curved upper surface 105U and the curved lower surface 213L during the reflow process, all of the external connectors 217 of the semiconductor package 250 contact the respective conductive pads 107 of the substrate 105, and therefore, are physically and electronically coupled with the respective conductive pads 107.

Note that in cases where the semiconductor package 250 has a flat lower surface 213L during the reflow process, the CTE and the structure of the carrier 101 are designed to result in a flat upper surface 105U for the substrate 105 to match the flat lower surface 213L, in which case the carrier 101 is used to ensure little or no warpage for the substrate 105, or at least little or no warpage for the upper surface 105U of the substrate 105. Therefore, in the discussion herein, inducing a predetermined level of warpage to the substrate 105 such that a warpage of the substrate 105 substantially matches a warpage of the substrate 213 includes the special case when the substrate 105 and the substrate 213 are flat (e.g., warpage is zero), in which case the CTE of the carrier 101 is tuned (e.g., to be equal to the CTE of the substrate 105) to maintain a flat surface 105U for the substrate 105 to match a flat lower surface 213L. In addition, since the carrier 101 and the substrate 105 may each comprise more than one materials (e.g., more than one CTEs), the CTE of the carrier 101 and the CTE of the substrate 105 may refer to the overall (e.g., average) CTE of the carrier 101 and the overall CTE of the substrate 105, respectively.

In some embodiments, tuning the CTE of the carrier 101 comprises varying the CTE of the carrier 101, such that the upper surface 105U of the substrate 105 substantially matches the lower surface 213L of the semiconductor package 250 during the reflow process. Factors such as the dimensions of the carrier 101, the dimensions of the substrate 105, the CTE and the structure of the substrate 105, may be used in determining the CTE of the carrier 101. Computer molding and simulations may be used to estimate the specifics regarding the warpage of the substrate 105 for a given CTE of the carrier 101. In addition, experiments using different materials (and different CTEs) for the carrier 101 may be conducted, and the moiré patterns may be measured and analyzed by a defect inspector. In some embodiments, computer molding and simulations are used to determine a potential CTE value for the carrier 101, or a range of CTE values for the carrier 101. Then, experiments using different materials with different CTE values are conducted, and moiré pattern measurement and analysis are performed to confirm and/or to fine tune the CTE value of the carrier 101, until a target specifics for the warpage of the substrate 105 is achieved.

FIGS. 3A and 3B show the carrier 101 as having a single layer structure. The carrier 101 may have a multi-segment structure and/or a multi-layer structure, as illustrated in FIGS. 18-21. Compared with a carrier made of a single bulk material, the multi-segment structure and the multi-layer structure (see FIGS. 18-21) allow for increased flexibility in choosing the structure and the materials used for constructing the carrier 101. With more parameters to tune in the design of the carrier 101, increased design flexibility is achieved, which allows for more degrees of freedom in designing the carrier 101 to meet the target specifics of the induced warpage of the substrate 105 at the reflow temperature. For example, induced warpage for the substrate 105 with complex shapes (e.g., a non-symmetric curved upper surface 105U) may be achieved by using the multi-segment and/or multi-layer structures, which complex shapes may not be achievable previously.

Figure 18:
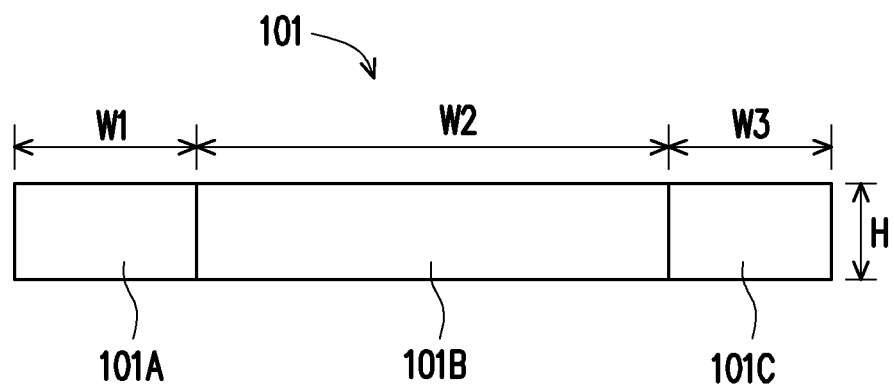
FIGS. 18-21 illustrates cross-sectional views of a carrier in various embodiments.

Referring to FIG. 18, a cross-sectional view of the carrier 101 is illustrated. The carrier 101 has a multi-segment structure, which comprises a first segment 101A, a second segment 101B, and a third segment 101C. The first segment 101A has a first width $W_1$ and a first CTE value, the second segment 101B has a second width $W_2$ and a second CTE value, and the third segment 101C has a third width $W_3$ and a third CTE value. In the illustrated embodiment, the first segment 101A, the second segment 101B, and the third segment 101C have a same high H.

The widths (e.g., W1, W2, and W3) and the CTE values (e.g., the first CTE value, the second CTE value, and the third CTE value) of the different segments (e.g., 101A, 101B, and 101C) of the carrier 101 may be chosen independently of one another, thus allowing for great flexibility in the design of the carrier 101. In some embodiments, the widths W1, W2, and W3 have different values. In some embodiments, the first CTE value, the second CTE value, and the third CTE value have different values. In another embodiment, the first segment 101A and the third segment 101C have a same width and a same CTE value, and the second segment 101B has a different width and a different CTE value from those of the first segment 101A (and the third segment 101C).

Figure 19:
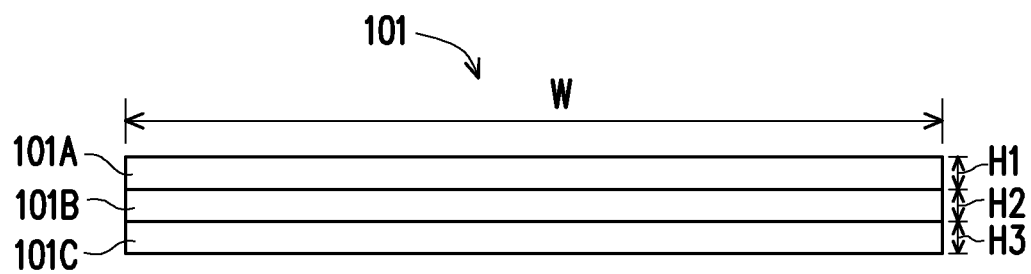

FIG. 19 illustrates the cross-sectional view of the carrier 101 in some embodiments. The carrier 101 has a multi-layer structure, which comprises a first layer 101A, a second layer 101B, and a third layer 101C. The first layer 101A has a first height $H_1$ and a first CTE value, the second layer 101B has a second height $H_2$ and a second CTE value, and the third layer 101C has a third height $H_3$ and a third CTE value. In the illustrated embodiment, the first layer 101A, the second layer 101B, and the third layer 101C have a same width W.

Still referring to FIG. 19, the heights (e.g., $H_1$, $H_2$, and $H_3$) and the CTE values (e.g., the first CTE value, the second CTE value, and the third CTE value) of the different layers (e.g., 101A, 101B, and 101C) of the carrier 101 may be chosen independently of one another, thus allowing for great flexibility in the design of the carrier 101. In some embodiments, the heights $H_1$, $H_2$, and $H_3$ have different values. In some embodiments, the first CTE value, the second CTE value, and the third CTE value have different values. In another embodiment, the first CTE value of the first layer 101A is larger than a second CTE value of the second layer 101B, and the second CTE value of the second layer 101B is larger than the third CTE value of the third layer 101C.

Figure 20:
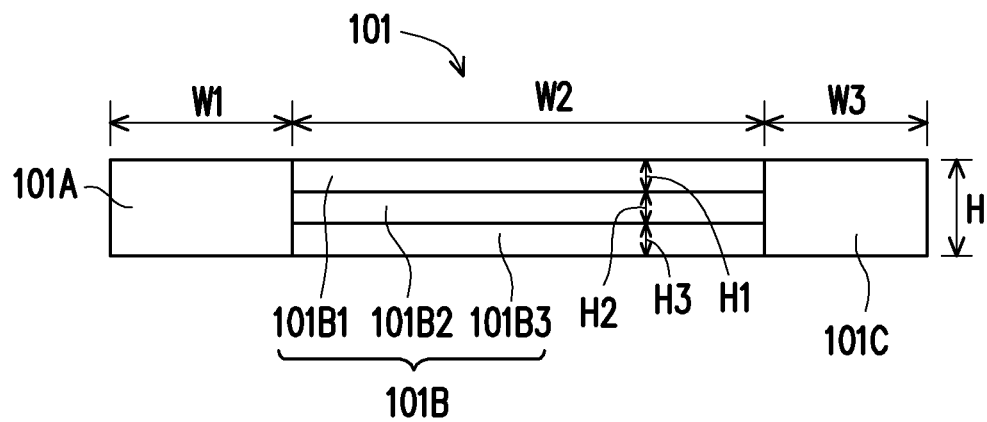
Figure 21:
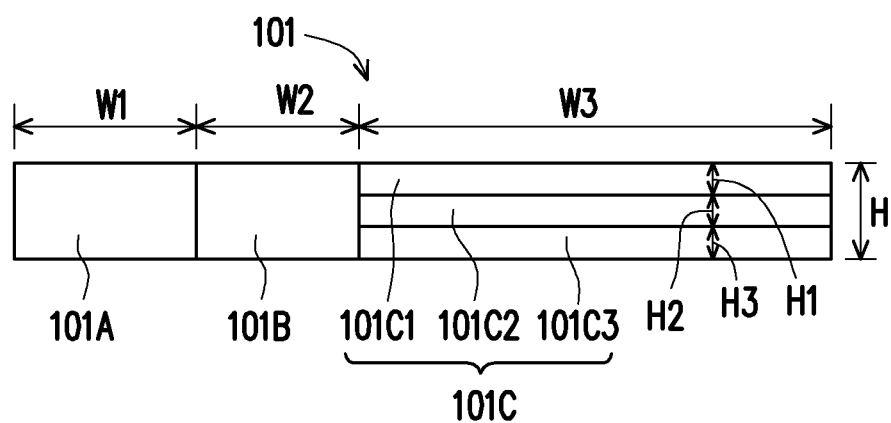

The multi-segment structure in FIG. 18 and the multi-layer structure in FIG. 19 may be combined to construct the carrier 101, as illustrated in FIGS. 20 and 21. Referring to FIG. 20, the carrier 101 is similar to the carrier 101 in FIG. 18, except that the middle segment 101B has a multi-layer structure similar to that illustrated in FIG. 19. In the illustrated example of FIG. 20, the layers 101B1, 101B2 and 101B3 have heights $H_1$, $H_2$, and $H_3$, respectively, and a common width $W_2$. The sum of the heights $H_1$, $H_2$, and $H_3$ is equal to the height H of the other segments 101A and 101C, in some embodiments. The dimensions (e.g., heights, widths) and the CTE values of the different segments/layers of the carrier 101 may be adjusted independently from one another to achieve target specifics for the warpage of the substrate 105 at the reflow temperature.

FIG. 21 illustrates yet another embodiment for the carrier 101. The carrier 101 in FIG. 21 is similar to the carrier 101 in FIG. 20, but with the location of the multi-layer segment (which is denoted by 101C) at the right side of the carrier 101. Other details may be similar to those of FIG. 20, thus are not repeated.

FIGS. 18-21 are merely non-limiting examples. Other modifications and variations are possible, and are fully intended to be included within the scope of the present disclosure. For example, the number of segments in the multi-segment structure may be more or less than three. Similarly, the number of layers in the multi-layer structure may be more or less than three. In addition, in embodiments with a combination of the multi-segment structure and the multi-layer structure, more than one segments of the carrier 101 may have the multi-layer structure, and the location of the segment(s) having multi-layer structure may be any suitable segment(s) of the carrier 101.

Advantages of the present disclosure include reduced device failure rate and improved manufacturing yield. By matching the warpage of the upper surface 105U of the substrate 105 with the warpage of the lower surface 213L of the semiconductor package 250 at the reflow temperature, the external connectors 217 of the semiconductor package 250 contact the respective conductive pads 107 on the upper surface 105U of the substrate 105, thus preventing or reducing cold joints. In a previous method where clamps are used during the reflow process to clamp the left side and the right side of the semiconductor package 250 in order to reduce the warpage of the semiconductor package 250, the clamped portions of the semiconductor package 250 experience high stress and may break during the reflow process, and the middle portion of the semiconductor package 250, which is not clamped, may still exhibit warpage and have the cold joint problem. In contrast, the present disclosures does not clamp the semiconductor package 250, thus avoiding the problem associated with clamping. Furthermore, the carrier 101 fully supports the lower surface of the substrate 105, thus is able to distribute the stress of the substrate 105 across a large area (e.g., the lower surface of the substrate 105) and prevents or reduces damage to the substrate 105. The multi-layer structure and multi-segment structure of the carrier 101 allow for great flexibility in choosing the structure and materials for the carrier 101. Complex shapes for the warpage of the substrate 105 may be achieved, which may not be possible using existing carrier designs.

Figure 4:
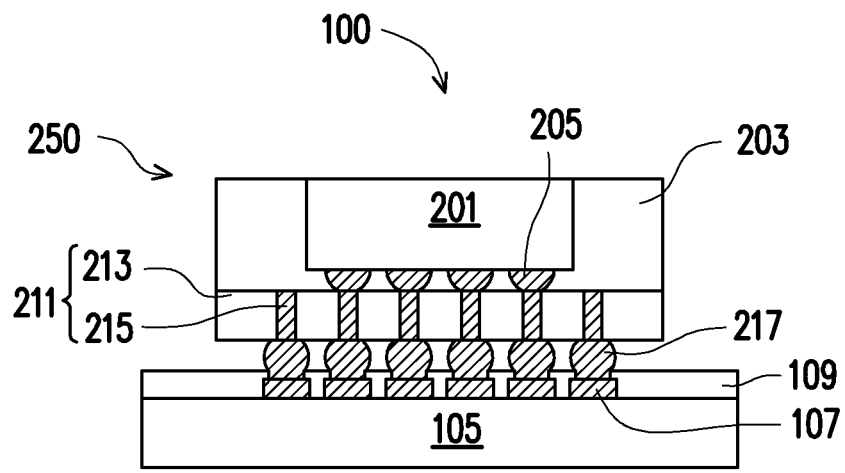

Referring now to FIG. 4, the carrier 101 is removed after the bonding process, e.g., after the semiconductor device 100 cools down to room temperature. The carrier 101 may be removed by applying a ultra-violet (UV) light or a laser to the adhesive layer 103 (see FIG. 3A), e.g., through the carrier 101 which may be transparent for the UV light or the laser. In some embodiments, the adhesive layer 103 is removed by applying water to the adhesive layer. Other suitable methods, such as mechanical stripping, etching, grinding, may also be used. After the carrier 101 is removed, residues of the adhesive layer 103, if any, may be removed by an additional cleaning process. The semiconductor device 100 shown in FIG. 4 therefore forms a CoWoS package, in some embodiments.

FIGS. 5-8 illustrate the cross-sectional views of a semiconductor device 100 at various stages of fabrication, in another embodiment. Similar numerals in FIGS. 5-8 denote similar components as in FIGS. 1-4. The embodiment of FIGS. 5-8 is similar to that illustrated in FIGS. 1-4, except that the substrate 105 is attached to the carrier 101 without using an adhesive layer 103. In an exemplary embodiment, the carrier 101 in FIGS. 5-8 is an electro-static chuck. By supplying an electrical voltage to the electro-static chuck, the substrate 105 is attached to the electro-static chuck by the force of attraction of opposite electrical charges. By stopping the electrical field (e.g., by stopping supplying electrical voltage to the electro-static chuck), the substrate 105 can be removed from the carrier 101 easily. Since there is no adhesive layer to remove, the number of process steps and processing time are reduced.

Figure 5:
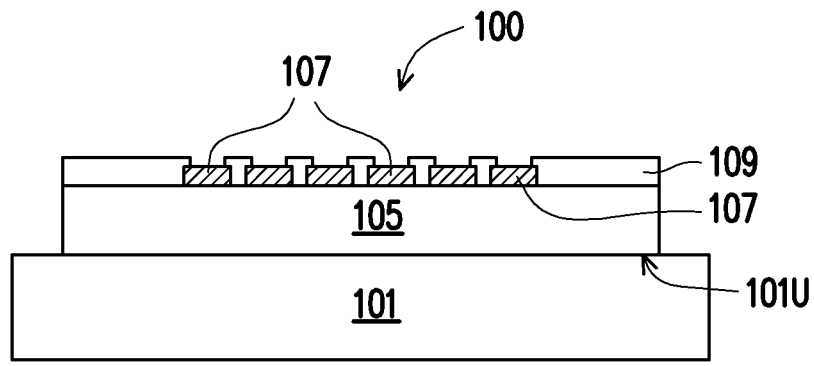
FIGS. 5-8 illustrate cross-sectional views of a semiconductor device at various stages of fabrication, in accordance with an embodiment.
Figure 6:
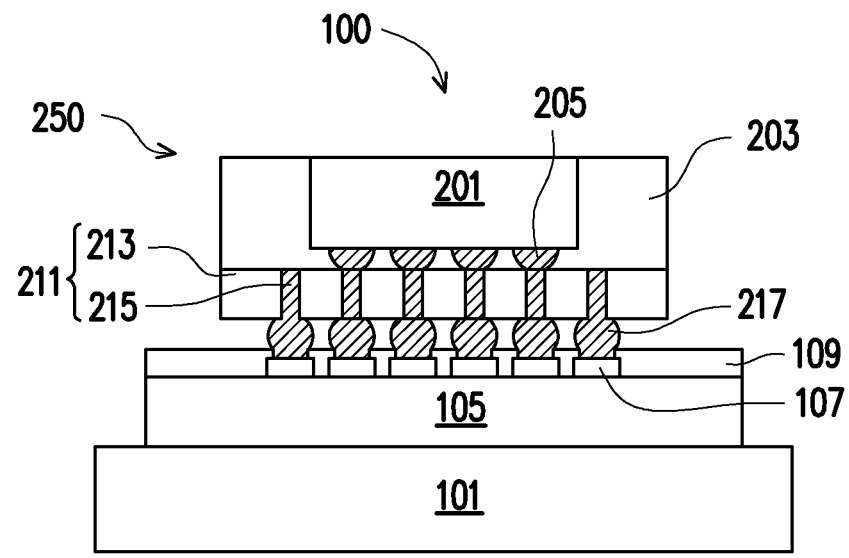
Figure 7:
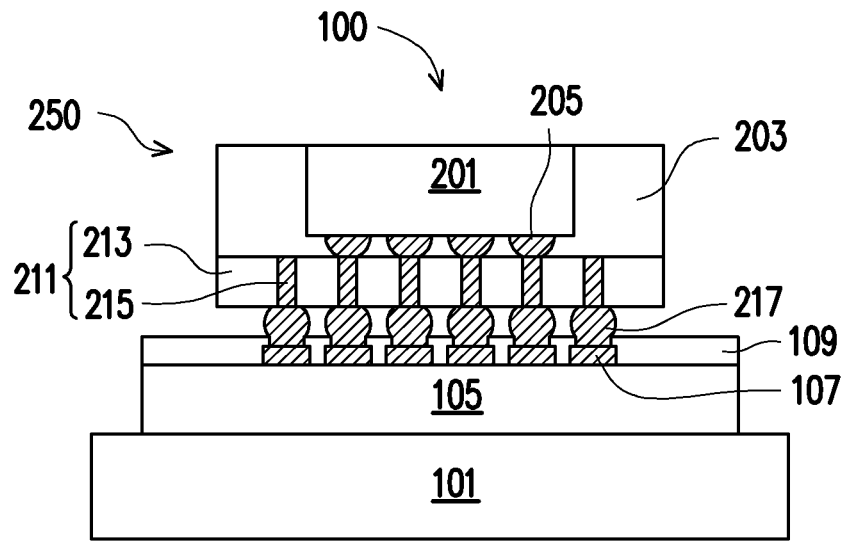
Figure 8:
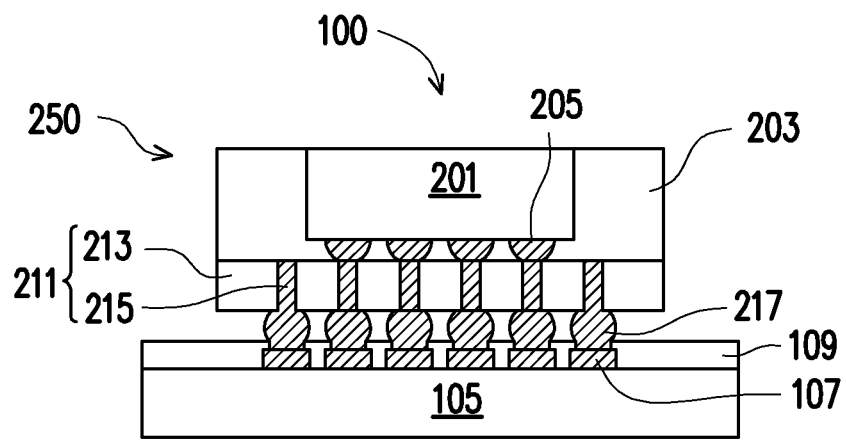

In FIG. 5, the substrate 105 is attached to the carrier 101 (an electro-static chuck) by supplying a voltage to the carrier 101. In FIG. 6, the semiconductor package 250 is disposed over the substrate 105, with the external connectors 217 aligned with respective conductive pads 107 on the upper surface of the substrate 105. Solder paste (not shown) may be formed over the conductive pads 107. In FIG. 7, the external connectors 217 of the semiconductor package 20 are physically and electrically bonded to respective conductive pads 107 in a bonding process (e.g., a reflow process). In some embodiments, the carrier 101 is designed to induce an predetermined level of warpage to the substrate 105 at the reflow temperature, such that the external connectors 217 contact respective conductive pads 107 during the reflow process, thus avoiding or reducing cold joints. Details of the carrier 101 may be similar to those discussed above with reference to FIGS. 1-4 and 18-21, thus are not repeated. In FIG. 8, the carrier 101 is removed from the substrate 105 after the bonding process by stopping supplying the voltage to the carrier 101.

FIGS. 9-13 illustrate the cross-sectional views of a semiconductor device 100 at various stages of fabrication, in another embodiment. The embodiment of FIGS. 9-13 is similar to that of FIGS. 1-4, except that instead of a CoW package 250, an InFO package 350 is attached to the conductive pads 107 of the substrate 105. Similar numerals in FIGS. 9-13 denote similar components as in FIGS. 1-4.

Figure 9:
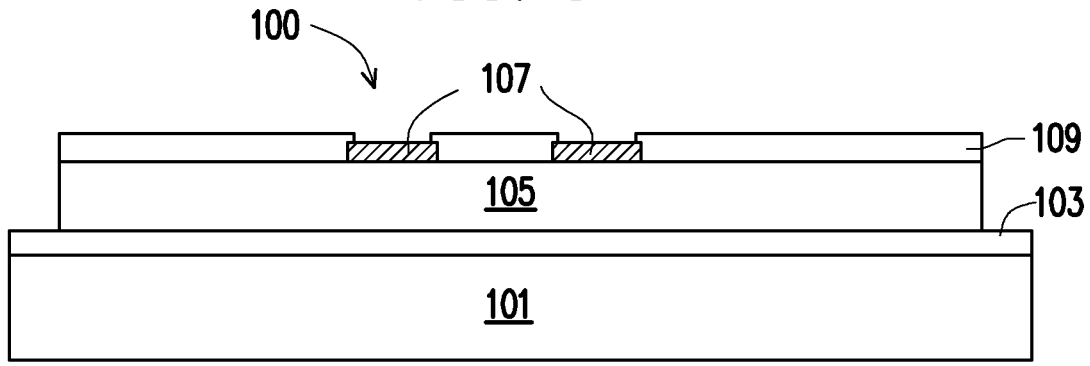
FIGS. 9-13 illustrate cross-sectional views of a semiconductor device at various stages of fabrication, in accordance with an embodiment.

In FIG. 9, the substrate 105 is attached to the carrier 101. Details of the substrate 105 and the carrier 101 are similar to those discussed above with reference to FIG. 1, thus are not repeated.

Figure 10:
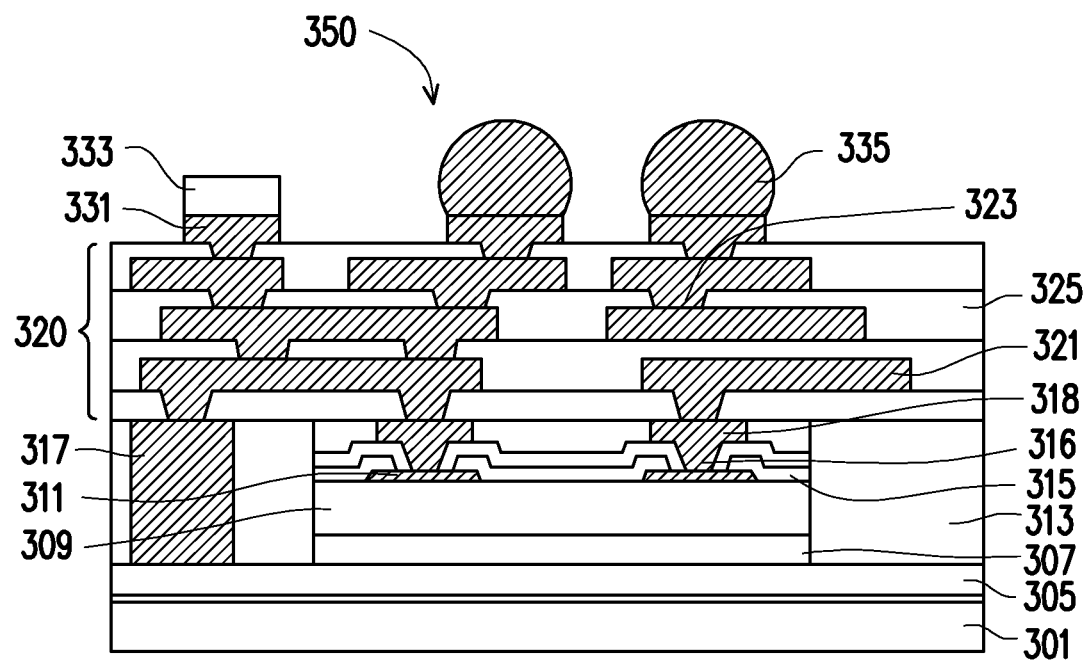

FIG. 10 illustrates a cross-sectional view of the InFO package 350. As illustrated in FIG. 10, a back side dielectric layer 305 is formed over a carrier 301. The back side dielectric layer 305 may be a backside passivation layer, and may comprise polymer, polyimide, silicon oxide, silicon nitride, or other suitable material formed by PVC, CVD, or other suitable deposition method. The carrier 301 may contain base material such as silicon, polymer, polymer composite, metal foil, ceramic, glass, glass epoxy, beryllium oxide, tape, or other suitable material for structural support. An adhesive layer, such as a light-to-heat-conversion (LTHC) film, may be formed between the back side dielectric layer 305 and the carrier 301.

A die 309 is attached to the back side dielectric layer 305 via, e.g., a DAF 307. Looking at the die 309, contact pads 311 are formed over the upper surface of the die 309, and passivation layers 315 are formed over the contact pads 311. Vias 316 extends through the passivation layers 315 and are electrically connected to the contact pads 311. Conductive pads 318 are formed over the passivation layers 315 and are electrically connected to the vias 316. Details regarding the formation of the die 309 may be similar to those of die 201 in FIG. 2, thus are not repeated.

Vias 317 are formed over the back side dielectric layer 305 and laterally spaced apart from the die 309. The vias 317 may comprise conductive material such as copper, tungsten, and may be formed by forming a seed layer over the back side dielectric layer 305, forming a patterned photoresist over the seed layer, plating to fill openings of the patterned photoresist layer, and removing the photoresist and portions of the seed layer outside boundaries of the vias 317. Vias 317 may be formed before or after the die 309 is attached to the dielectric layer 305.

Next, a molding material 313 is formed over the back side dielectric layer 305. The molding material 313 surrounds the die 309 and the vias 317. The molding material 313 may be a molding compound, epoxy, or the like, and may be applied by compression molding, transfer molding, or the like. After curing, the molding material 313 may undergo a grinding process such as a chemical mechanical planarization (CMP) process to expose upper surfaces of the vias 317 and the conductive pads 318 of the die 309.

Next, a redistribution structure 320 is formed over the molding material 313 and the die 309. Redistribution structure 320 may include one or more RDLs (e.g., conductive lines 321, vias 323) formed in one or more dielectric layers 325. The through via 317 is electrically coupled to the RDLs of the redistribution structure 320. The RDLs of the redistribution structure 320 are also electrically coupled to the die 309. The RDLs of the redistribution structure 320 may be formed of a metal such as aluminum, copper, tungsten, titanium, or combinations thereof, and may be formed by physical vapor deposition (PVD), chemical vapor deposition (CVD), plating, or other suitable deposition method. The one or more dielectric layers 325 of the redistribution structure 320 may comprise silicon oxide, silicon nitride, low-k dielectrics such as carbon doped oxides, extremely low-k dielectrics such as porous carbon doped silicon dioxide, combinations of these, or the like, and may be formed through a process such as CVD, PVD, or any other suitable deposition method.

Next, as illustrated in FIG. 10, under-bump metallurgy (UBM) structures 331 are formed over the top surface of the redistribution structure 320. The UBM structures 331 may be formed by depositing and patterning an conductive material such as copper, gold, or aluminum over the redistribution structure 320. Electrical components 333, such as integrated-passive devices (IPDs), may be coupled to the UBM structures 331. External connectors 335, such as ball-grid-arrays (BGAs), conductive pillars (e.g., copper pillars), or conductive pillars with solder regions on the top, may be formed on the UBM structures 331. Next, not shown, the InFO package 350 in FIG. 10 is flipped upside-down, and the external connectors 335 are attached to a tape such as dicing tape. The carrier 301 is then removed from the IFO package 350 by a de-bonding process. In some embodiments, a plurality of InFO packages (not shown) are formed together on the carrier 101 before the carrier 101 was removed, therefore, dicing may be performed after the carrier 101 is removed to produce a plurality of individual InFO packages 350.

Figure 11:
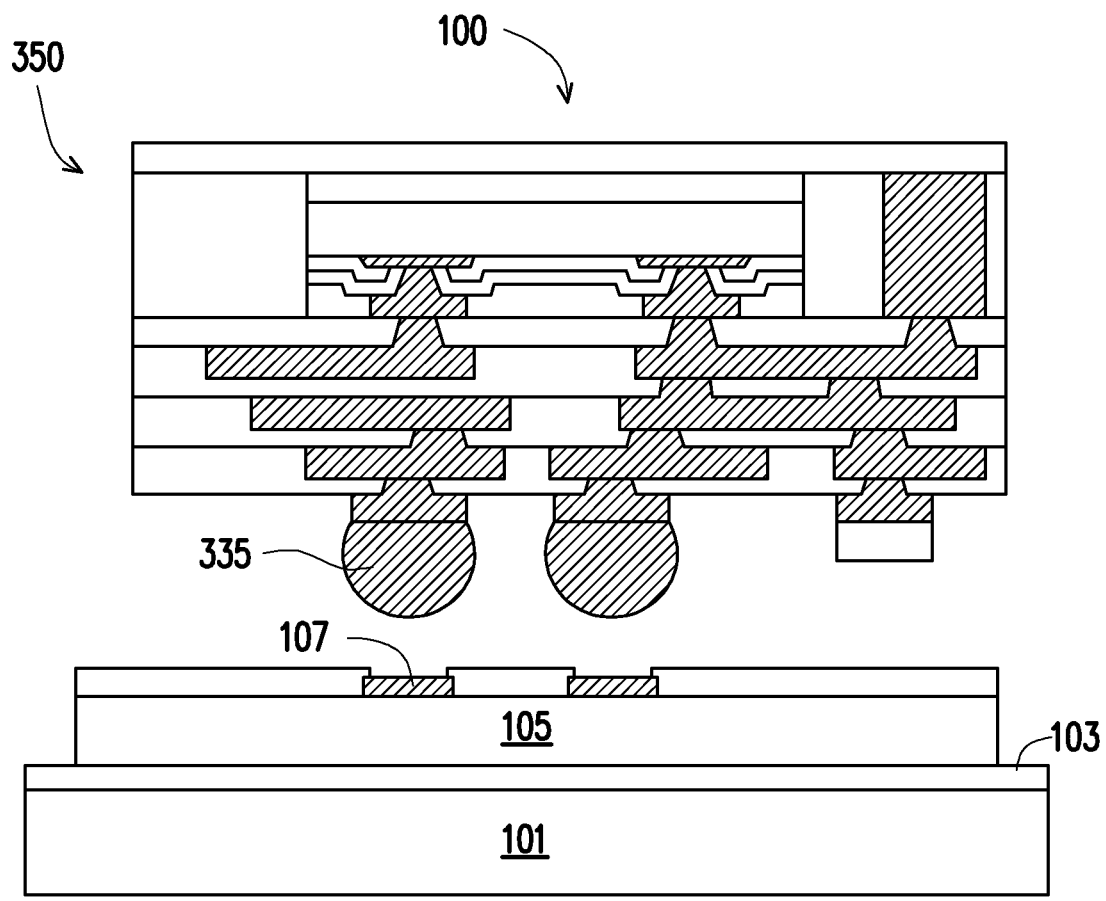

In FIG. 11, the InFO package 350 is disposed over the substrate 105. External connectors 335 of the InFO package 350 are aligned with respective conductive pads 107 of the substrate 105. Solder paste (not shown) may be formed over the conductive pads 107 of the substrate 105 using, e.g., a solder jet printing process.

Figure 12:
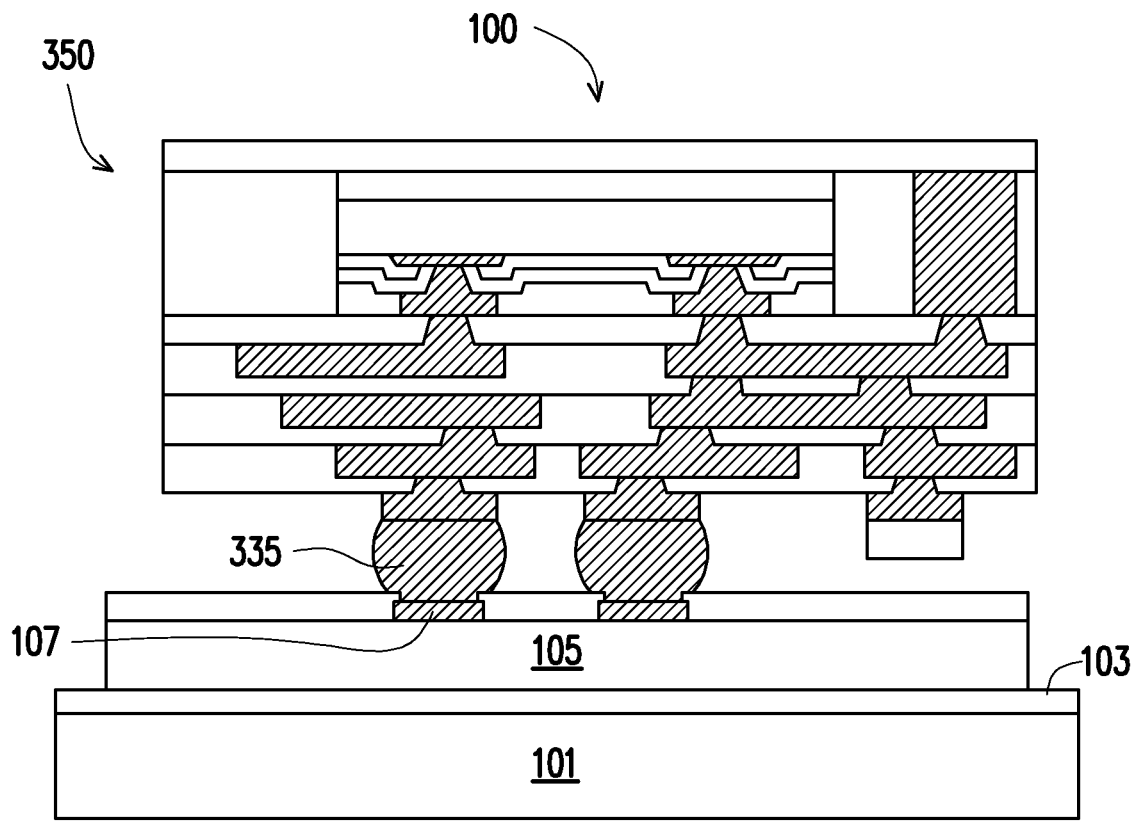

In FIG. 12, a bonding process such as a reflow process is performed to physically and electrically couple the external connectors 335 of the InFO package 350 to the conductive pads 107 of the substrate 105. In some embodiments, the carrier 101 is designed to induce an predetermined level of warpage to the substrate 105 at the reflow temperature, such that the external connectors 335 contact respective conductive pads 107 during the reflow process, thus avoiding or reducing cold joint. In some embodiments, the CTE of the carrier 101 is tuned such that a first warpage (e.g., a curved upper surface) of the substrate 105, caused by the CTE mismatch between the carrier 101 and the substrate 105, substantially matches a second warpage (e.g., a curved lower surface) of the InFO package 350. Details of the carrier 101 may be similar to those discussed above with reference to FIGS. 1-4 and 18-21, thus are not repeated.

Figure 13:
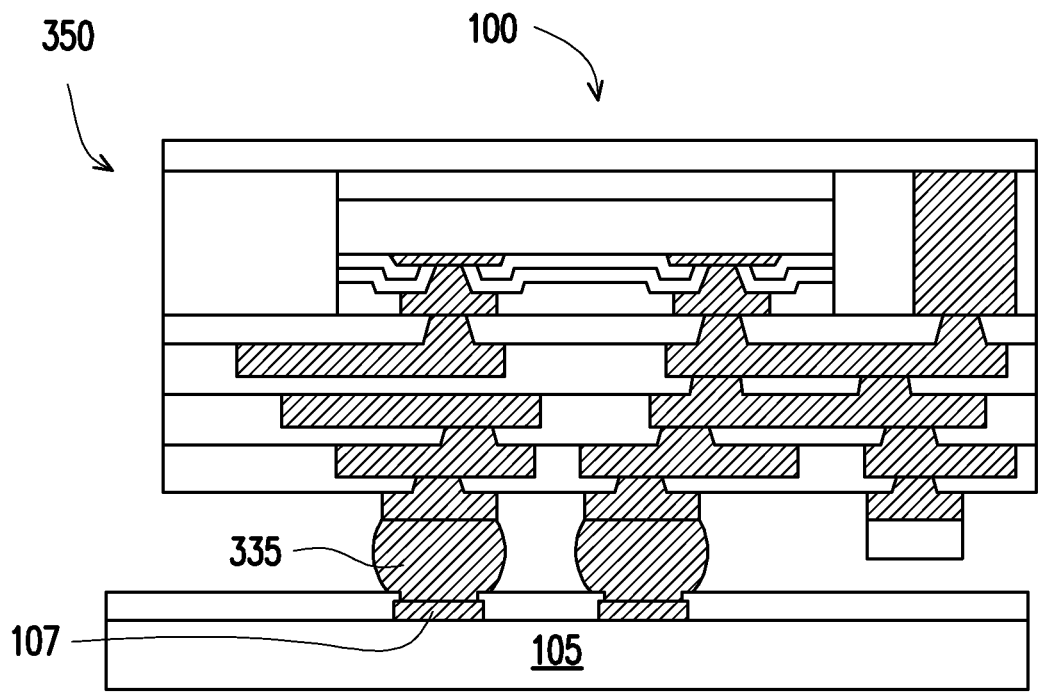

In FIG. 13, the carrier 101 is removed using processing steps similar to those discussed above with reference to FIG. 4. Details are not repeated.

FIGS. 14-17 illustrate the cross-sectional views of a semiconductor device 100 at various stages of fabrication, in another embodiment. Similar numerals in FIGS. 14-17 denote similar components as in FIGS. 9-13. The embodiment of FIGS. 14-17 is similar to that of FIGS. 9-13, except that the substrate 105 is attached to the carrier 101 without using an adhesive layer 103. In an exemplary embodiment, the carrier 101 is an electro-static chuck. By supplying an electrical voltage to the electro-static chuck, the substrate 105 is attached to the electro-static chuck. By stopping the electrical field, the substrate 105 can be removed from the carrier 101 easily. Since there is no adhesive layer to remove, the number of processing steps and processing time are reduced.

Figure 14:
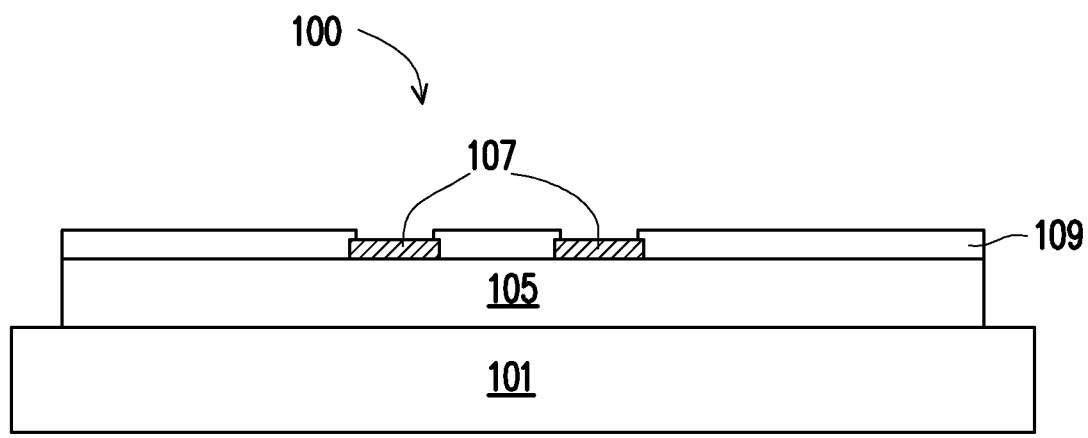
FIGS. 14-17 illustrate cross-sectional views of a semiconductor device at various stages of fabrication, in accordance with an embodiment.
Figure 15:
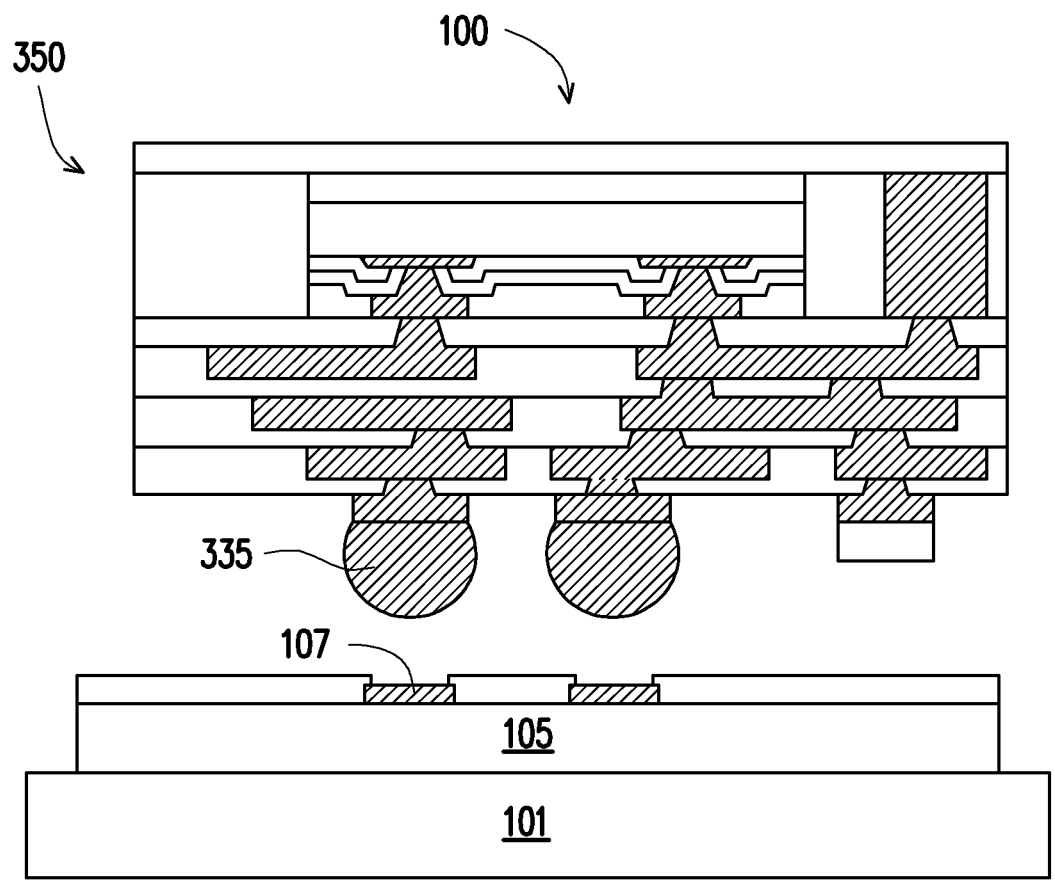
Figure 16:
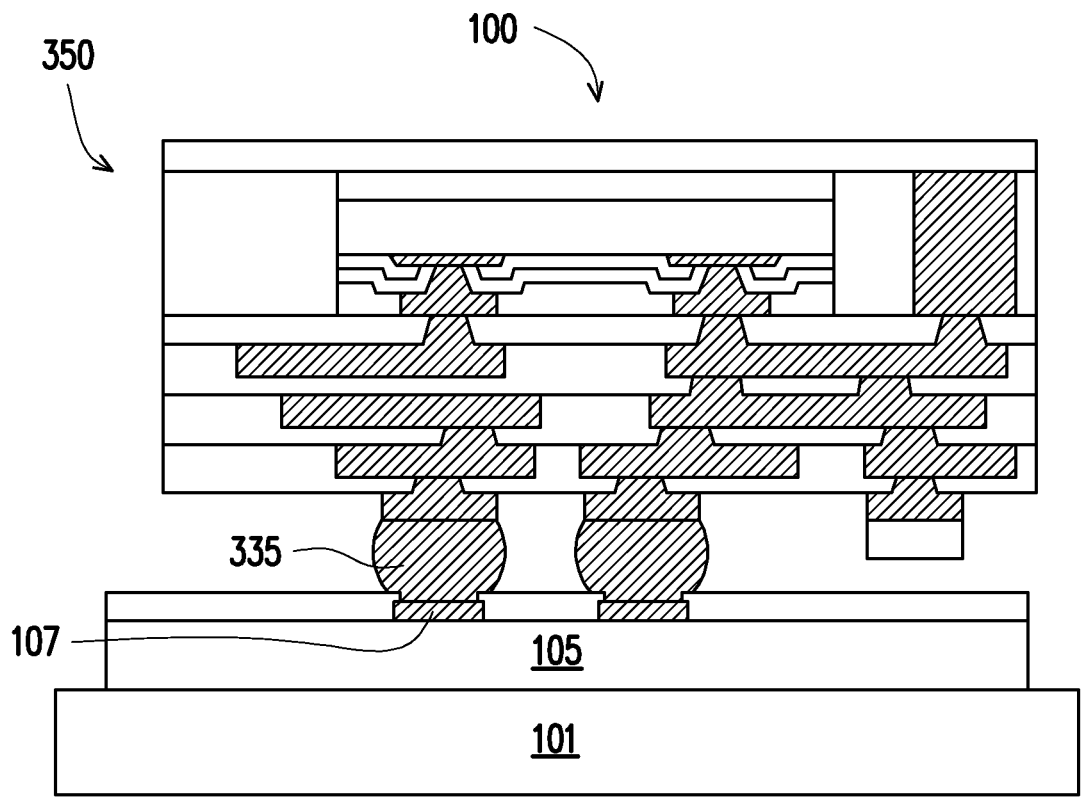
Figure 17:
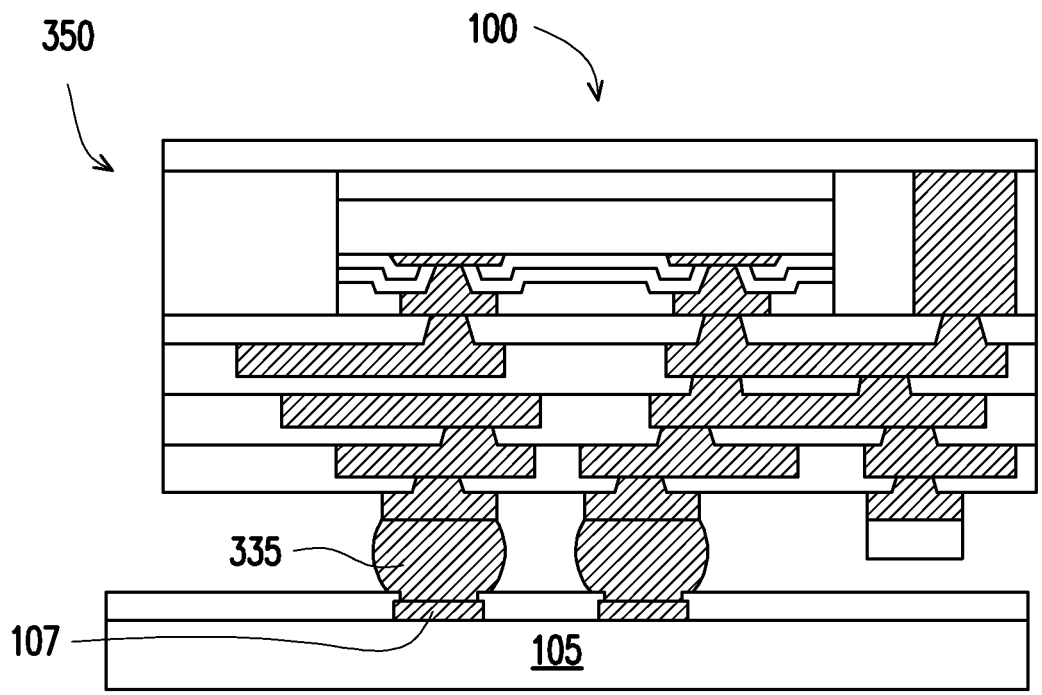

In FIG. 14, the substrate 105 is attached to the carrier 101 (an electric chuck) by supplying a voltage to the carrier 101. In FIG. 15, the semiconductor package 350 (e.g., an InFO package) is disposed over the substrate 105, with the external connectors 335 aligned with respective conductive pads 107 on the upper surface of the substrate 105. Solder paste (not shown) may be formed over the conductive pads 107. In FIG. 16, the external connectors 335 of the semiconductor package 350 are physically and electrically bonded to respective conductive pads 107 during a bonding process (e.g., a reflow process). In some embodiments, the carrier 101 is designed to induce an predetermined level of warpage to the substrate 105 at the reflow temperature, such that the external connectors 335 contact respective conductive pads 107 during the reflow process, thus avoiding or reducing cold joints. Details of the carrier 101 may be similar to those discussed above with reference to FIGS. 1-4 and 18-21, thus are not repeated. In FIG. 17, the carrier 101 is removed from the substrate 105 after the reflow process by stopping supplying the voltage to the carrier 101.

Embodiments of the present disclosure may achieve many advantages. For example, by proper design of the carrier 101, a predetermined warpage may be induced to the substrate 105 to match the warpage of the semiconductor device (e.g., 250 in FIG. 3A, and 350 in FIG. 12) during the reflow process. Cold joints are avoided, and yield of production is increased. The present disclosure does not need a clamp to for clamping the semiconductor device, thus avoiding damages to the semiconductor package related to uneven-distribution of stress. In addition, the multi-layer structure and the multi-segment structure of the carrier 101 allow for great flexibility in the design of the carrier 101. Complex shapes for the warpage of substrate 105 may be achieved, which may not be possible previously.

Figure 22:
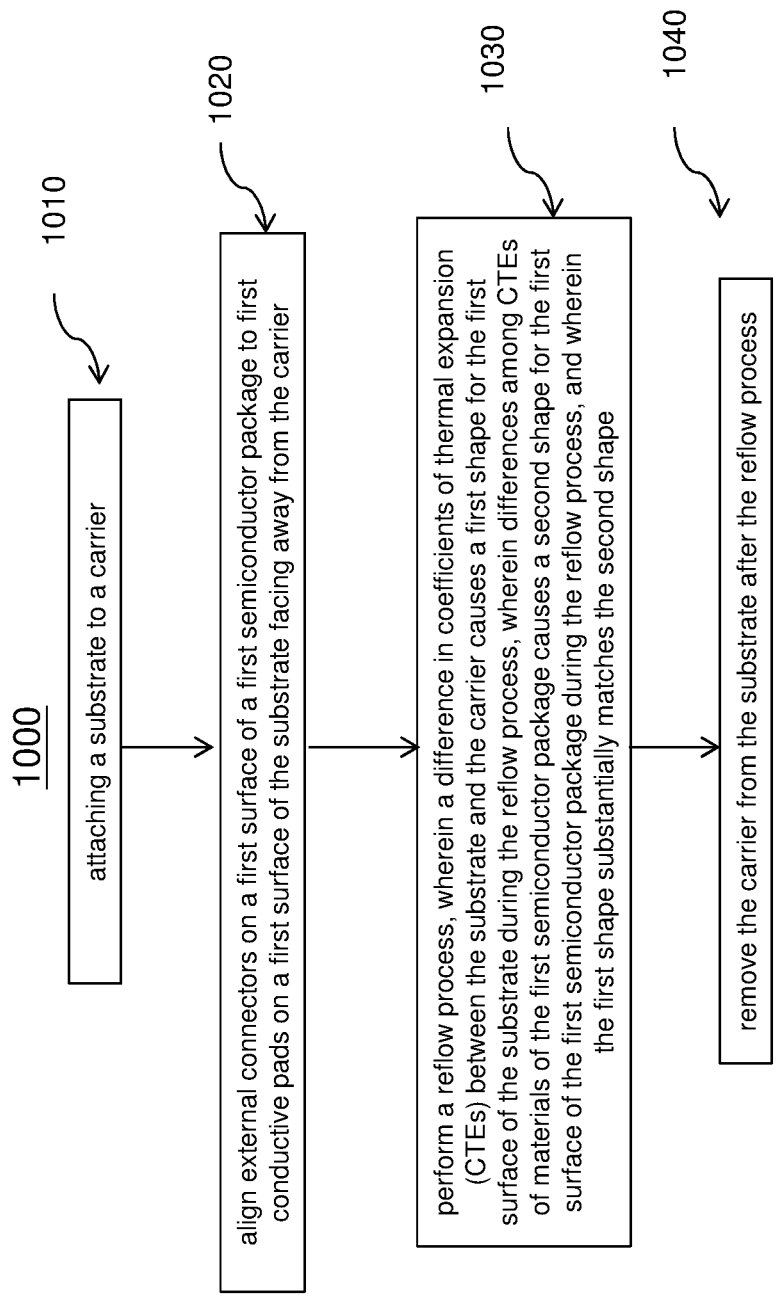
FIG. 22 illustrates a flow chart for a method of manufacturing a semiconductor device, in accordance with some embodiments.

FIG. 22 illustrates a flow chart of a method of fabricating a semiconductor structure, in accordance with some embodiments. It should be understood that the embodiment method shown in FIG. 22 is merely an example of many possible embodiment methods. One of ordinary skill in the art would recognize many variations, alternatives, and modifications. For example, various steps as illustrated in FIG. 22 may be added, removed, replaced, rearranged and repeated.

Referring to FIG. 22, at step 1010, a substrate is attached to a carrier. At step 1020, external connectors of a first semiconductor package are aligned to first conductive pads on a first surface of the substrate facing away from the carrier. At step 1030, a reflow process is performed, where a first mismatch of coefficients of thermal expansion (CTEs) between the substrate and the carrier causes a first warpage of the substrate during the reflow process, where a second mismatch of CTEs between materials of the first semiconductor package causes a second warpage of the first semiconductor package during the reflow process, and where the first warpage substantially matches the second warpage. At step 1040, the carrier is removed from the substrate after the reflow process.

In an embodiment, a method includes attaching a substrate to a carrier; aligning external connectors on a first surface of a first semiconductor package to first conductive pads on a first surface of the substrate facing away from the carrier; performing a reflow process, where a difference in coefficients of thermal expansion (CTEs) between the substrate and the carrier causes a first shape for the first surface of the substrate during the reflow process, where differences among CTEs of materials of the first semiconductor package causes a second shape for the first surface of the first semiconductor package during the reflow process, and where the first shape substantially matches the second shape; and removing the carrier from the substrate after the reflow process. The method further includes removing the carrier from the substrate after the reflow process. In an embodiment, attaching the substrate to the carrier includes attaching the substrate to the carrier using an adhesive layer. In an embodiment, the carrier is an electro-static chuck, where attaching the substrate to the carrier includes supplying an electrical voltage to the electro-static chuck. In an embodiment, the substrate is a printed circuit board (PCB). In an embodiment, the first shape and the second shape are curved shapes. In an embodiment, performing the reflow process physically and electrically couple the first semiconductor package to the substrate. In an embodiment, the method further includes before performing the reflow process, aligning external connectors of a second semiconductor package to second conductive pads on the first surface of the substrate, where the reflow process physically and electrically couples the first semiconductor package and the second semiconductor package to the substrate. In an embodiment, the substrate has a rectangular shape, a square shape, a polygon shape, or a circular shape.

In an embodiment, a method includes tuning a coefficient of thermal expansion (CTE) of a carrier; attaching a first side of a substrate to the carrier, the substrate having conductive pads on a second side of the substrate opposing the first side; placing a semiconductor package over the second side of the substrate, where external connectors on a first side of the semiconductor package facing the substrate are aligned with respective conductive pads of the substrate; and heating the substrate, the carrier, and the semiconductor package, where the first side of the semiconductor package has a first curved shape during the heating, where the CTE of the carrier is tuned with respect to a CTE of the substrate such that the second side of the substrate has a second curved shape during the heating, and where the first curved shape substantially matches the second curved shape. In an embodiment, the method further includes removing the carrier from the substrate after heating the substrate, the carrier, and the semiconductor package. In an embodiment, the external connectors of the semiconductor package contact respective conductive pads of the substrate during the heating. In an embodiment, the method further includes analyzing a warpage of the semiconductor package at a heating temperature, and determining the first curved shape of the first side of the semiconductor package at the heating temperature. In an embodiment, the substrate is a printed circuit board. In an embodiment, the semiconductor package includes a semiconductor die, a molding material around the semiconductor die, conductive features electrically coupled to the semiconductor die and extending beyond boundaries of the semiconductor die, and the external connectors electrically coupled to the conductive features, where the conductive features are between the semiconductor die and the external connectors. In an embodiment, the conductive features are redistribution layers (RDLs) of a redistribution structure between the semiconductor die and the external connectors. In an embodiment, the conductive features are vias of an interposer between the semiconductor die and the external connectors.

In an embodiment, a method includes attaching a first side of a substrate to a carrier; and bonding a semiconductor package to a second side of the substrate opposing the first side at a bonding temperature, where a first side of the semiconductor package facing the substrate has a first curved shape at the bonding temperature, where differences of coefficients of thermal expansion (CTEs) between the carrier and the substrate result in a second curved shape for the second side of the substrate at the bonding temperature, and where the first curved shape matches the second curved shape. In an embodiment, bonding the semiconductor package includes bonding external connectors of the semiconductor package to contact pads disposed on the second side of the substrate, where the external connectors of the semiconductor package contact respective conductive pads of the substrate during the bonding. In an embodiment, the method further includes analyzing a warpage of the semiconductor package at the bonding temperature. In an embodiment, the analyzing comprises measuring and analyzing moiré patterns of the semiconductor package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

What is claimed is:

1. A method comprising:
    attaching a first surface of a substrate to a first surface of a carrier, wherein the first surface of the substrate extends along and contacts the first surface of the carrier, wherein a structure and materials of the carrier comprise:
        a first material extending continuously from the first surface of the carrier to a second surface of the carrier furthest from the substrate;
        a second material extending continuously from the first surface of the carrier to the second surface of the carrier, wherein the second material is different from the first material and is disposed laterally adjacent to the first material, wherein the first material and the second material of the carrier are chosen to increase a warpage of the substrate at a reflow temperature compared with a room temperature; and
        a multi-layer structure laterally between and in contact with the first material and the second material, wherein the multi-layer structure extends continuously from the first surface of the carrier to the second surface of the carrier, wherein the multi-layer structure comprises:
            a first sublayer; and
            a second sublayer over the first sublayer, wherein sidewalls of the first sublayer are aligned with respective sidewalls of the second sublayer, wherein each of the first material, the second material, the first sublayer, and the second sublayer comprises a different material, wherein the first material, the second material, and the multi-layer structure have a coplanar upper surface and a coplanar lower surface;
    aligning external connectors on a first surface of a first semiconductor package to first conductive pads on a second surface of the substrate facing away from the carrier;
    performing a reflow process, wherein a difference in coefficients of thermal expansion (CTEs) between the substrate and the carrier causes a first shape for the second surface of the substrate during the reflow process, wherein differences among CTEs of materials of the first semiconductor package causes a second shape for the first surface of the first semiconductor package during the reflow process, and wherein the first shape substantially matches the second shape;
removing the carrier from the substrate after the reflow process, where the carrier is intact after removing the carrier;
after removing the carrier, attaching a first surface of another substrate to the first surface of the carrier; and
performing another reflow process to bond a second semiconductor package to a second surface of the another substrate.

2. The method of claim 1, wherein the carrier is an electro-static chuck, wherein the structure and the materials of the carrier are designed specifically to induce a warpage in the substrate during the reflow process such that the first shape of the substrate substantially matches the second shape of the first semiconductor package.

3. The method of claim 1, wherein the substrate is a printed circuit board (PCB).

4. The method of claim 3, wherein the first shape and the second shape are curved shapes.

5. The method of claim 1, wherein performing the reflow process physically and electrically couple the first semiconductor package to the substrate.

6. The method of claim 1, further comprising before performing the reflow process, aligning external connectors of a second semiconductor package to second conductive pads on the second surface of the substrate, wherein the reflow process physically and electrically couples the first semiconductor package and the second semiconductor package to the substrate.

7. The method of claim 1, wherein the substrate has a rectangular shape, a square shape, a polygon shape, or a circular shape.

8. A method comprising:
tuning a coefficient of thermal expansion (CTE) of a carrier, wherein tuning the CTE of the carrier comprises:
forming a first segment of the carrier using a first material having a first CTE, the first material extending continuously from a first surface of the carrier to a second surface of the carrier opposing the first surface;
forming a second segment of the carrier using a second material having a second CTE different from the first CTE, the second material extending continuously from the first surface of the carrier to the second surface of the carrier; and
forming a multi-layer structure laterally adjacent to the first segment and the second segment, wherein the multi-layer structure, the first segment, and the second segment have a same thickness, wherein the multi-layer structure comprises a plurality of sublayers having a same width, wherein each of the first segment, the second segment, and the plurality of sublayers has a different CTE;
attaching a first side of a substrate to the first surface of the carrier, the substrate having conductive pads on a second side of the substrate opposing the first side, wherein the first side of the substrate contacts and extends along the first surface of the carrier, wherein the second surface of the carrier is a surface of the carrier furthest from the substrate;
placing a semiconductor package over the second side of the substrate, wherein external connectors on a first side of the semiconductor package facing the substrate are aligned with respective conductive pads of the substrate;
heating the substrate, the carrier, and the semiconductor package, wherein the first side of the semiconductor package has a first curved shape during the heating, wherein the CTE of the carrier is tuned with respect to a CTE of the substrate such that during the heating, a warpage of the substrate is increased compared with that at a room temperature, and the second side of the substrate has a second curved shape, and wherein the first curved shape substantially matches the second curved shape;
removing the carrier from the substrate after the heating, wherein the carrier is intact after removing the carrier; and
after removing the carrier, attaching a first side of another substrate to the first surface of the carrier.

9. The method of claim 8, wherein the external connectors of the semiconductor package contact respective conductive pads of the substrate during the heating.

10. The method of claim 8, further comprising:
analyzing a warpage of the semiconductor package at a heating temperature; and
determining the first curved shape of the first side of the semiconductor package at the heating temperature.

11. The method of claim 8, wherein the substrate is a printed circuit board.

12. The method of claim 8, wherein the semiconductor package comprises:
a semiconductor die;
a molding material around the semiconductor die;
conductive features electrically coupled to the semiconductor die and extending beyond boundaries of the semiconductor die; and
the external connectors electrically coupled to the conductive features, wherein the conductive features are between the semiconductor die and the external connectors.

13. The method of claim 12, wherein the conductive features are redistribution layers (RDLs) of a redistribution structure between the semiconductor die and the external connectors.

14. The method of claim 12, wherein the conductive features are vias of an interposer between the semiconductor die and the external connectors.

15. A method comprising:
attaching a first side of a substrate to a first surface of a carrier, wherein the first side of the substrate contacts and extends along the first surface of the carrier, wherein the carrier comprises:
a first segment formed of a first material, the first material extending continuously from the first surface of the carrier to an opposing second surface of the carrier distal from the substrate;
a second segment formed of a second material different from the first material, the second segment being laterally adjacent to the first segment and having a same thickness as the first segment; and
a multi-layer structure laterally adjacent to the first segment and the second segment, wherein the multi-layer structure, the first segment, and the second segment have a coplanar upper surface and a coplanar lower surface, wherein the multi-layer structure comprises a plurality of sublayers having a same width, wherein each of the first segment, the second segment, and the plurality of sublayers has a different coefficient of thermal expansion;
bonding a semiconductor package to a second side of the substrate opposing the first side at a bonding temperature, wherein a first side of the semiconductor package facing the substrate has a first curved shape at the bonding temperature, wherein differences of coefficients of thermal expansion (CTEs) between the carrier and the substrate increase a warpage of the substrate at the bonding temperature compared with a room temperature, and result in a second curved shape for the second side of the substrate at the bonding temperature, and wherein the first curved shape matches the second curved shape;

removing the carrier from the substrate after the bonding, where the carrier is intact after removing the carrier; and after removing the carrier, attaching another substrate to the carrier for bonding with another semiconductor package.

16. The method of claim 15, wherein bonding the semiconductor package comprises bonding external connectors of the semiconductor package to conductive pads disposed on the second side of the substrate, wherein the external connectors of the semiconductor package contact respective conductive pads of the substrate during the bonding.

17. The method of claim 15, further comprising analyzing a warpage of the semiconductor package at the bonding temperature.

18. The method of claim 17, wherein the analyzing comprises measuring and analyzing moiré patterns of the semiconductor package.

19. The method of claim 15, wherein a first sidewall of the first segment contacts and extends long a second sidewall of the second segment.

20. The method of claim 15, wherein the carrier is a chuck, and wherein the chuck is designed for the semiconductor package such that the chuck generates the second curved shape for the second side of the substrate at the bonding temperature.

* * * * *